(12) United States Patent
Fujisawa et al.

(10) Patent No.: US 7,414,874 B2
(45) Date of Patent: Aug. 19, 2008

(54) SEMICONDUCTOR MEMORY DEVICE

(75) Inventors: Hiroki Fujisawa, Tokyo (JP); Isamu Fujii, Kodaira (JP); Yuko Watanabe, Kodaira (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/588,328

(22) Filed: Oct. 27, 2006

(65) Prior Publication Data
US 2007/0096156 A1    May 3, 2007

(30) Foreign Application Priority Data
Nov. 1, 2005    (JP)    ............................. 2005-318143

(51) Int. Cl.
*G11C 5/02*    (2006.01)
(52) U.S. Cl. ................ 365/51; 365/230.01; 365/230.03
(58) Field of Classification Search .................... 365/51, 365/52, 63, 205, 230.01, 230.03
See application file for complete search history.

(56) References Cited

U.S. PATENT DOCUMENTS

| 6,314,042 | B1 * | 11/2001 | Tomishima et al. .... | 365/230.03 |
|---|---|---|---|---|
| 6,418,067 | B1 * | 7/2002 | Watanabe et al. ........... | 365/200 |
| 6,646,946 | B2 * | 11/2003 | Tomishima et al. .... | 365/230.03 |
| 6,781,915 | B2 * | 8/2004 | Arimoto et al. ........ | 365/230.03 |
| 7,110,282 | B2 * | 9/2006 | Kono et al. ............ | 365/230.03 |
| 2004/0085839 | A1 | 5/2004 | Takemura et al. | |
| 2005/0068838 | A1 * | 3/2005 | Kono et al. ............ | 365/230.01 |

FOREIGN PATENT DOCUMENTS

JP    2000-243085    9/2000

* cited by examiner

*Primary Examiner*—Gene N. Auduong
(74) *Attorney, Agent, or Firm*—McDermott Will & Emery LLP

(57) ABSTRACT

Disclosed is a semiconductor memory device comprising a memory cell array block, and a circuit region arranged with the memory cell array block along a first direction. The circuit region comprises a first region and a second region arranged with the first region along the first direction. The first region is provided with a first circuit and a second circuit which are aligned in a second direction perpendicular to the first direction. The second region is provided with a plurality of third circuits which are aligned in the second direction.

8 Claims, 14 Drawing Sheets

US 7,414,874 B2

SEMICONDUCTOR MEMORY DEVICE

BACKGROUND OF THE INVENTION

The present invention generally relates to a semiconductor memory device. More particularly, the present invention relates to a semiconductor memory device comprising a memory cell array and a circuit region in which a plurality of circuits are arranged.

JP-A 2000-243085 discloses a semiconductor memory device provided with a memory array and a circuit region, such as a sense amplifier region.

The disclosed semiconductor memory device further comprises a plurality pairs of complementary bit lines extending along a BL direction, a plurality of word lines extending along a WL direction perpendicular to the BL direction, a first line for supplying a first voltage, a second line for supplying a second voltage, a first common source line and a second common source line.

The memory array and the sense amplifier region are arranged in the BL direction. The sense amplifier region includes a plurality of sense amplifier aligned in the WL direction. The sense amplifier has sense nodes which are in contact with the complementary bit lines, respectively. Moreover, the sense amplifier has a first node and a second node which are in contact with the first and the second common source lines, respectively.

The sense amplifier region further includes a first region and a second region. The first region is provided with a plurality of first switches for connecting the first line to the first common source line. The second region is provided with a plurality of second switches for connecting the second line to the second common source line. The first switches and the second switches are aligned along the WL direction, respectively.

In the disclosed semiconductor memory device, the first and the second regions arranged along the BL direction are required for arranging the first and the second circuits along the WL direction.

It is an object of the present invention to provide a semiconductor memory device comprising an effectively utilized circuit region compared with conventional techniques.

SUMMARY OF THE INVENTION

According to an aspect of the present invention, there is provided a semiconductor memory device comprising a memory cell array block, and a circuit region arranged with the memory cell array block along a first direction. The circuit region comprises a first region and a second region arranged with the first region along the first direction. The first region is provided with a first circuit and a second circuit which are aligned in a second direction perpendicular to the first direction. The second region is provided with a plurality of third circuits which are aligned in the second direction.

These and other objects, features and advantages of the present invention will become more apparent upon reading of the following detailed description along with the accompanied drawings.

DESCRIPTION OF PREFERRED EMBODIMENTS

Figure 1:
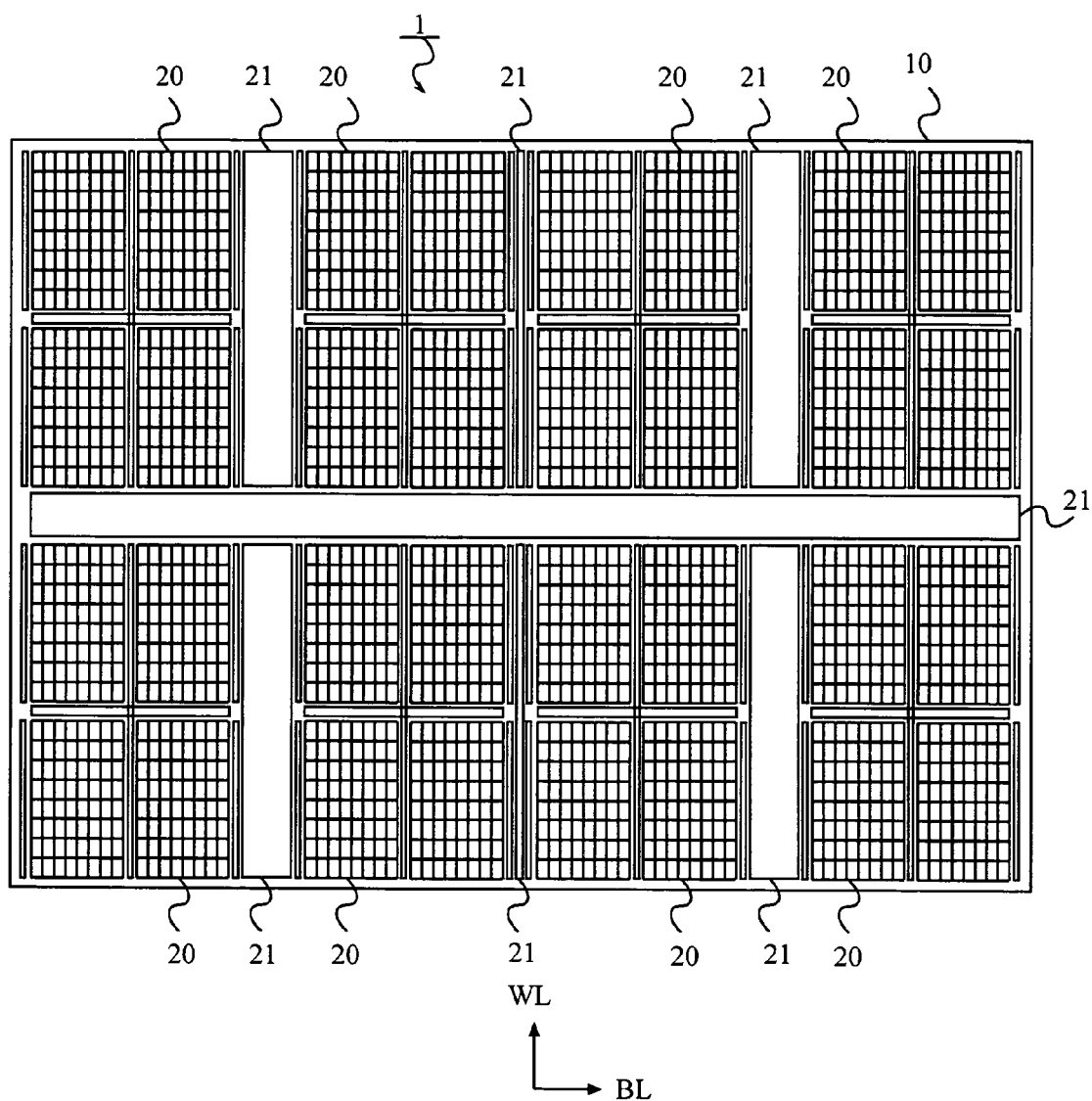
FIG. 1 is a plan view of an inside of a semiconductor memory device of an embodiment of the present invention.
Figure 2:
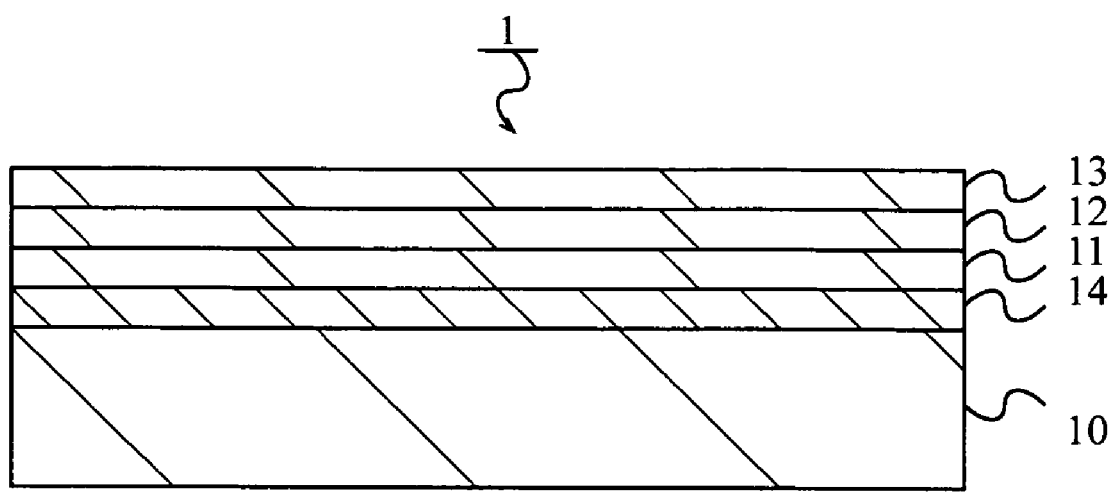
FIG. 2 is a schematic cross-sectional view of the semiconductor memory device of FIG. 1.

FIG. 1 shows a semiconductor memory device 1 according to a first embodiment of the present invention. Referring to FIG. 2, the semiconductor memory device 1 comprises a lower layer 10, a first line layer 11, a second line layer 12, a third line layer 13 and a fourth line layer 14. The semiconductor memory device 1 may comprises another layer provided with a circuit, a line, a plug, a terminal and so on. The semiconductor memory device 1 of this embodiment is a double data rate synchronous dynamic random access memory (DDR SDRAM). The present invention may apply to other semiconductor memory devices.

Referring to FIG. 1, the lower layer 10 includes a plurality of large-sized blocks 20 of memory cell array and a plurality of peripheral circuit regions 21. The large-sized blocks 20 are arranged in a matrix of two rows by four columns. The rows of the large-sized blocks 20 are arranged along a bit line (BL) direction. The columns of the large-sized blocks 20 are arranged along a word line (WL) direction perpendicular to the BL direction. Each of the plurality of peripheral circuit regions 21 is arranged between two of the large-sized blocks 20 and is provided with a control circuit, an output circuit, a power supply circuit, a plurality of terminals or the like.

Figure 3:
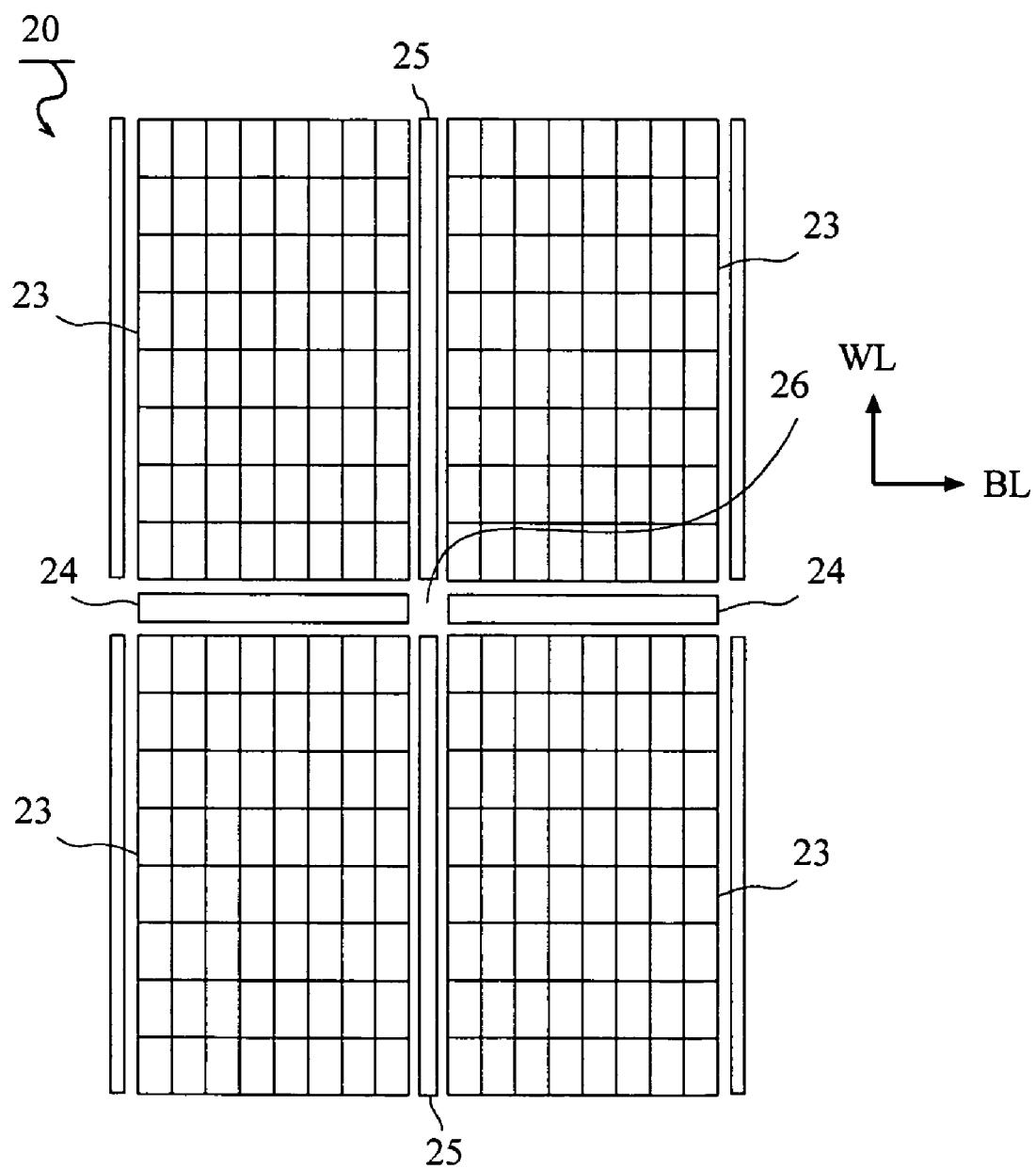
FIG. 3 is a plan view of the large-sized block of FIG. 1.

Referring to FIG. 3, the large-sized block 20 comprises a plurality of middle-sized blocks 23 of memory cell array, two X decoder (X-DEC) regions 24, two Y decoder (Y-DEC) regions 25 and an middle-sized intersection region 26. The middle-sized blocks 23 are arranged in a matrix of two rows by two columns. The rows of the middle-sized blocks 23 are arranged along the BL direction. The columns of the middle-sized blocks 23 are arranged along the WL direction. Each of the X decoder regions 24 is arranged between the middle-sized blocks 23 in the WL direction and is elongated along the BL direction. The X decoder region 24 includes a main word driver and a row address decoder. Each of the Y decoder regions 25 is arranged between the middle-sized blocks 23 in the BL direction and is elongated along the WL direction. The X decoder region 24 includes a column address decoder. The X decoder region 24 and the Y decoder region 25 may arranged at outside of the four middle-sized blocks 23. The middle-sized intersection region 26 is arranged at an area between the two X decoder regions 24 and between the two Y decoder regions 25. The middle-sized intersection region 26 includes a plurality of circuits. The middle-sized blocks 23 may be arranged between the X decoder regions 24 and/or between the Y decoder regions 25.

Figure 4:
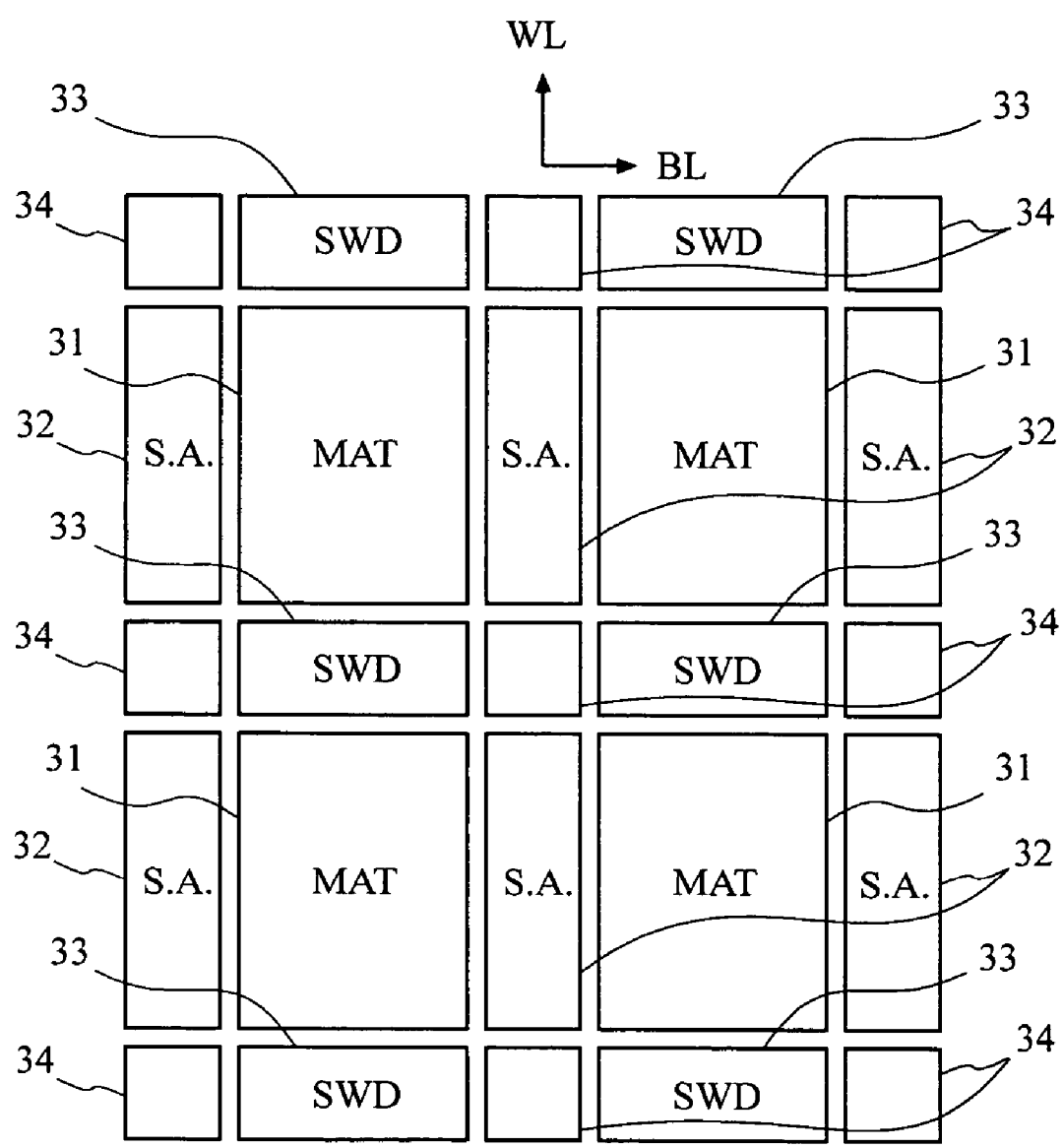
FIG. 4 is a plan view of the middle-sized block of FIG. 4.

Referring to FIG. 4, the middle-sized block 23 comprises a plurality of small-sized blocks 31 of memory cell array, a plurality of sense amplifier (S.A.) regions 32, a plurality of sub word driver (SWD) regions 33 and a plurality of small-sized intersection regions 34. The small-sized block 31 are arranged in a matrix of eight rows by eight columns. The rows of the small-sized blocks 31 are arranged along the BL direction. The columns of the small-sized blocks 31 are arranged along the WL direction. The S.A. regions 32 are arranged in a matrix. The SWD region 33 is arranged in a matrix. Each of the small-sized blocks 31 is arranged between the S.A. regions 32 in the BL direction. Each of the small-sized blocks 31 is arranged between the SWD regions 33 in the WL direction. Each of the small-sized intersection regions 34 is arranged between the S.A. regions 32 in the WL direction and/or between the SWD regions 33 in the BL direction.

In this embodiment, the first to third line layers 11 to 13 shown in FIG. 2 includes a plurality of lines made of aluminum (Al). The fourth line layer 14 includes a plurality of lines made of tungsten (W).

The first line layer 11 includes a YS line. The YS line is elongated along the BL direction, as shown in FIG. 7.

The second line layer 12 shown in FIG. 2 comprises a plurality of lines elongated along the WL direction across the S.A. regions 32 and the small-sized intersection regions 34 shown in FIG. 4. Referring to FIG. 7, the second line layer 12 comprises a VBLP line, a first common source line (NCS), a second common source line (PCS) and a plurality of signal lines. The signal lines includes a BLEQ0T line, an SHR0B line, an LIOT_0 line, an LIOB_0 line, an LIOT_1 line, an LIOB_1 line, an SHR1B line and a BLEQ1T line.

Figure 7:
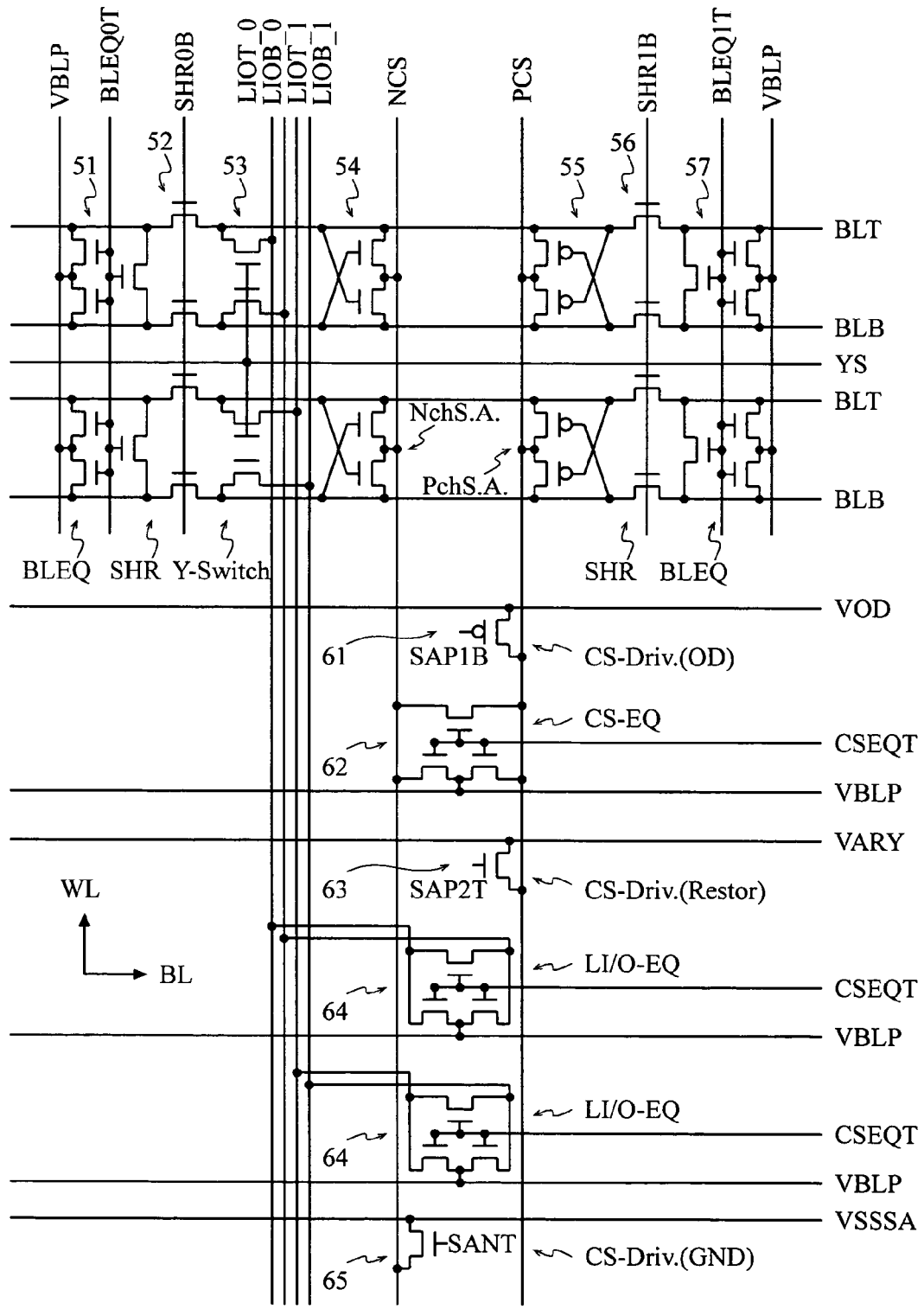
FIG. 7 is a partial circuit diagram of the sense amplifier region of FIG. 4.

The third line layer 13 shown in FIG. 2 comprises a plurality of CSEQT lines, a VOD line, a plurality of VBLP lines, a VARY line and a VSSSA line shown in FIG. 7. The CSEQT lines, the VOD line, the VBLP lines, the VARY line and the VSSSA line are elongated along the BL direction across the S.A. region 32 and the small-sized block 31 shown in FIG. 4.

The fourth line layer 14 illustrate in FIG. 2 comprises a plurality of complementary bit lines BLT and BLB shown in FIG. 4. The BLT line and the BLB line are elongated across the small-sized blocks 31 and the S.A. regions 32 along the BL direction as shown in FIG. 4. Referring to FIG. 7, the BLT lines and the BLB lines are arranged alternately. A plurality of pairs of the BLT line and the BLB line are elongated from the S.A. region 32 to both of the next S.A regions 32.

Figure 5:
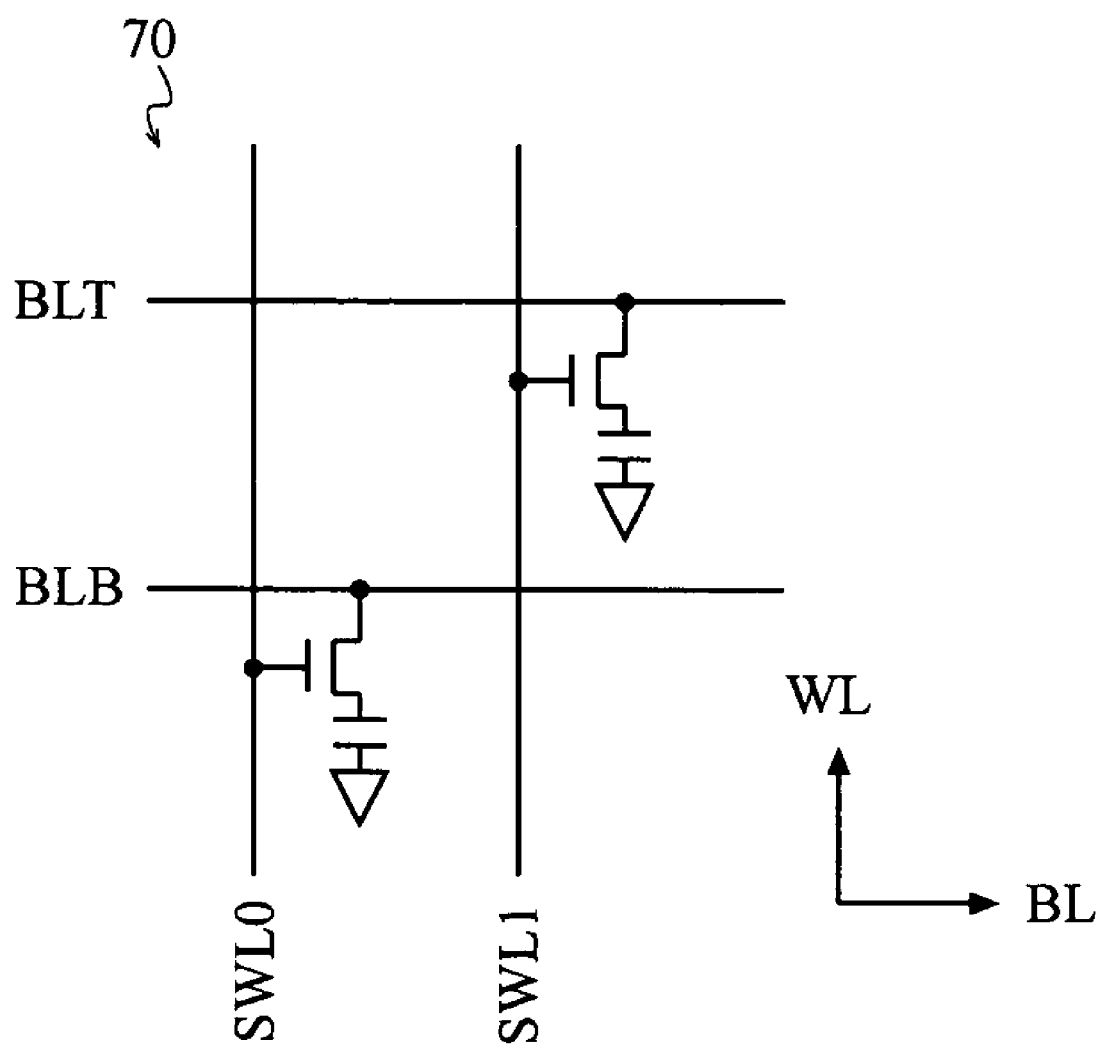
FIG. 5 is a partial circuit diagram of the small-sized block of FIG. 4.

Referring to FIG. 5, the small-sized block 31 includes a plurality of memory cells. The lower layer 10 comprises a plurality of sub word lines SWL0 to SWLm shown in FIG. 4 elongated in the small-sized block 31 and the SWD region 33 along the WL direction.

Each memory cell of the small-sized block 31 is disposed at an intersection of the sub word line and either any of the BLT line or the BLB line so as to be selected by the sub word line and the BLT line and the BLB line upon read/write operation.

Figure 6:
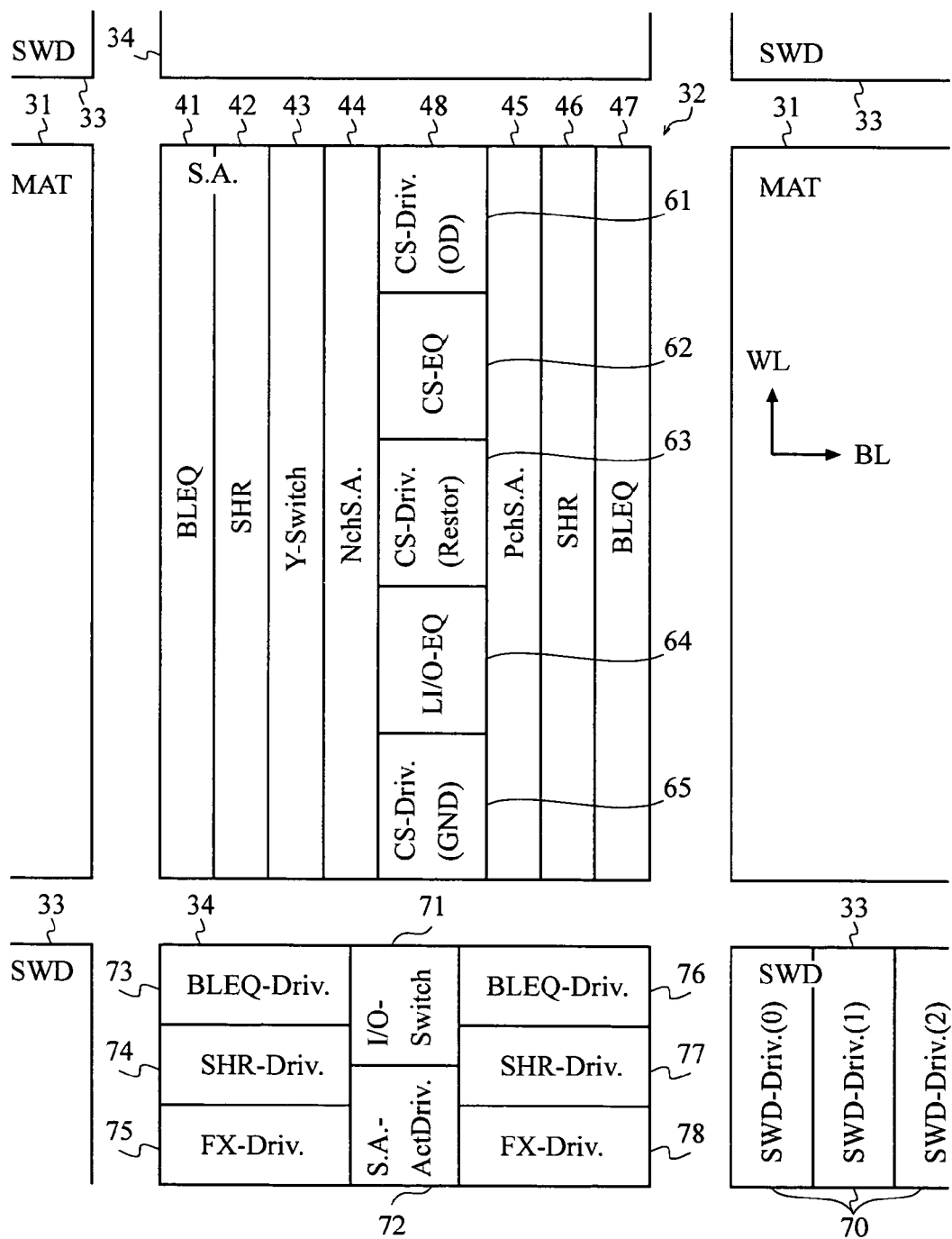
FIG. 6 is a plan view showing the sense amplifier region and its surroundings of FIG. 4.

Referring to FIG. 6, the S.A. region 32 comprises first to eighth regions 41 to 48 arranged along the BL direction in that order. Each of the first to the seventh regions 41 to 47 is elongated along the WL direction and comprises a plurality of circuits aligned along the WL direction. The eight region 48 is arranged between the fourth region 44 and the fifth region 45 and elongated along the WL direction.

The first region 41 shown in FIG. 6 comprises a plurality of first bit line equalizers (BLEQ) 51. Referring to FIG. 7, the first BLEQ 51 comprises a MOS transistor for connecting the BLT line and the VBLP line, a MOS transistor for connecting the BLB line and the VBLP line, and a MOS transistor for connecting the BLT line and the BLB line. All of the MOS transistors of the first BLEQ 51 have gates connected with the BLEQ0T line. The first BLEQ 51 charges the BLT line and the BLB line to a pre-charge voltage of the VBLP line in response to a BLEQ0T signal on the BLEQ0T line.

The seventh region 47 shown in FIG. 6 comprises a plurality of second BLEQ 57. The second BLEQ 57 pre-charges the BLT line and the BLB line to a pre-charge voltage of the VBLP line in response to a BLEQ1T signal on the BLEQ1T line.

The fourth region 44 shown in FIG. 6 comprises a plurality pairs of n-channel MOS transistors 54. Hereinafter, the pair of n-channel MOS transistors 54 is referred to as an NchS.A. 54. The fifth region 45 shown in FIG. 6 comprises a plurality pairs of p-channel MOS transistors 55. Hereinafter, the pair of p-channel MOS transistors 55 is referred to as an PchS.A. 55. The NchS.A. 54 and the PchS.A. 55 form an S.A. Referring to FIG. 7, the S.A. is in contact with the NCS line for supplying a ground voltage and the PCS line for supplying a power supply voltage. The S.A. amplifies a voltage difference between the BLT line and the BLB line.

The second region 42 shown in FIG. 6 comprises a plurality of first shared MOS transistors (SHR) 52. Referring to FIG. 7, the first SHR 52 comprises a MOS transistor inserted in the BLT line and another MOS transistor inserted in the BLB line. The MOS transistors of the first SHR 52 electrically connect the memory cells to the S.A in response to a SHR0B signal on the SHR0B line.

The sixth region 46 shown in FIG. 6 comprises a plurality of second SHRs 56 for connecting the memory cells to the S.A in response to a SHR1B signal on the SHR1B line. The first SHR 52 and the second SHR 56 are provided corresponding to different small-sized blocks 31 disposed adjacent to the S.A. region 32.

The third region 43 shown in FIG. 6 comprises a plurality of column selection circuits (Y-Switch) 53. The Y-Switch 53 comprises either a pair of a MOS transistor for connecting the BLT line to the LIOT_0 line and a MOS transistor for connecting the BLB line to the LIOB_0 line or a pair of a MOS transistor for connecting the BLT line to the LIOT_1 line and a MOS transistor for connecting the BLB line to the LIOB_1 line in response to a YS signal on the YS line.

Referring to FIG. 7, the first BLEQ 51, the first SHR 52, the Y-Switch 53, the NchS.A. 54, PchS.A. 55, the second SHR 56 and the second BLEQ 57 are connected with a pair of the BLT line and the BLB line and form a S.A. block.

Referring to FIG. 7, the eighth region 48 shown in FIG. 6 comprises a plurality of circuits including a driver for over-driving operation (CS-Driv. (OD)) 61, a common source equalizer (CS-EQ) 62, a driver for restoring operation (CS-Driv. (Restor)) 63, a pair of LI/O equalizers (LI/O-EQ) 64 and a driver for grounding operation (CS-Driv. (GND)) 65 aligned in that order along the WL direction. Each of the circuits of the eighth region 48 is provided for operating corresponding to all of the S.A. blocks or a part of the S.A. blocks. In this embodiment, functions of the circuits of the eighth region 48 are different from each other.

The CS-Driv. (OD) 61 comprises a MOS transistor for connecting the PCS line to the VOD line having an overdrive voltage higher than an ultimate amplified voltage in response to a SAP1B signal. The CS-Driv. (OD) 61 stabilizes the operation of the S.A.

The CS-EQ 62 charges the PCS line and the NCS line to a pre-charge voltage on the VBLP line in response to a CSEQT signal on the CSEQT line.

The CS-Driv. (Restor) 63 comprises a MOS transistor for connecting the PCS line to the VARY line in response to an SAP2T signal.

One of the LI/O-EQ 64 charges the LIOT_0 line and the LIOB_0 line to a pre-charge voltage supplied from the VBLP line in response to a CSEQT signal on the CSEQT line. Other one of the LI/O-EQ 64 charges the LIOT_1 line and the LIOB_1 line to the pre-charge voltage supplied from the VBLP line in response to a CSEQT signal on the CSEQT line.

The CS-Driv. (GND) 65 comprises a MOS transistor for connecting the NCS line to the VSSSA line having a ground voltage in response to an SANT signal.

Figure 8:
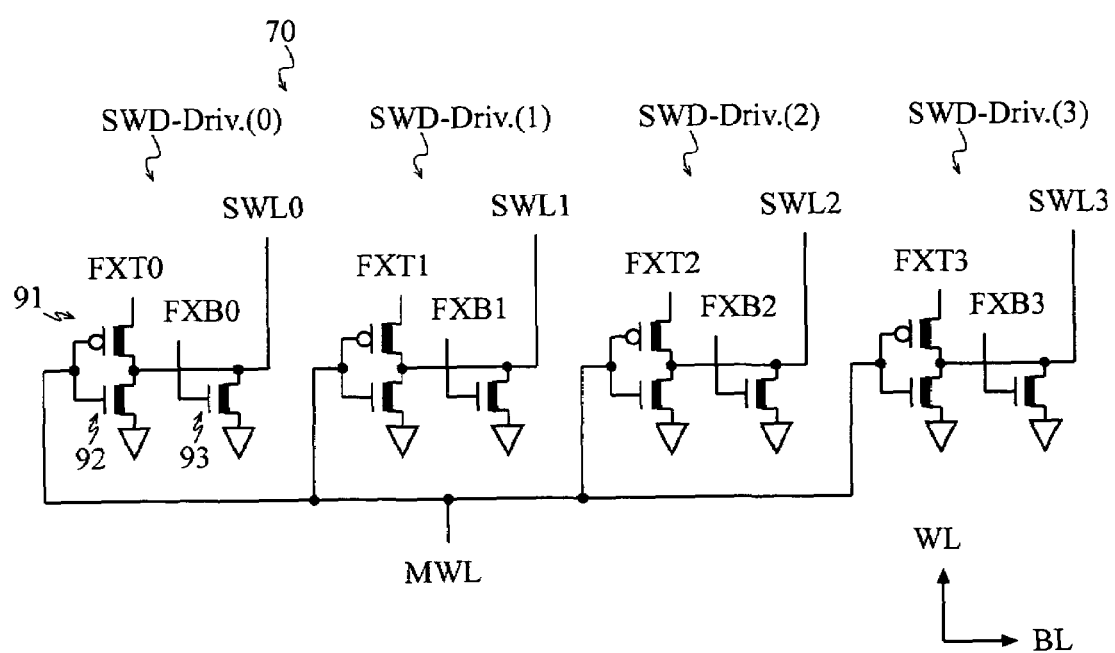
FIG. 8 is a partial circuit diagram of the sub word driver region of FIG. 4.

Referring to FIG. 8, the SWD region 33 shown in FIG. 6 comprises a plurality pairs of sub word drivers (SWD-Driv.'s (0) to (3)) 70 aligned along the BL direction. The word lines include a plurality pairs of SWL0 to SWL3 selected by the SWD-Driv.'s (0) to (3) 70 in response to FXT0 to FXT3 signals, FXB0 to FXB3 signals and an MWL signal.

Figure 9:
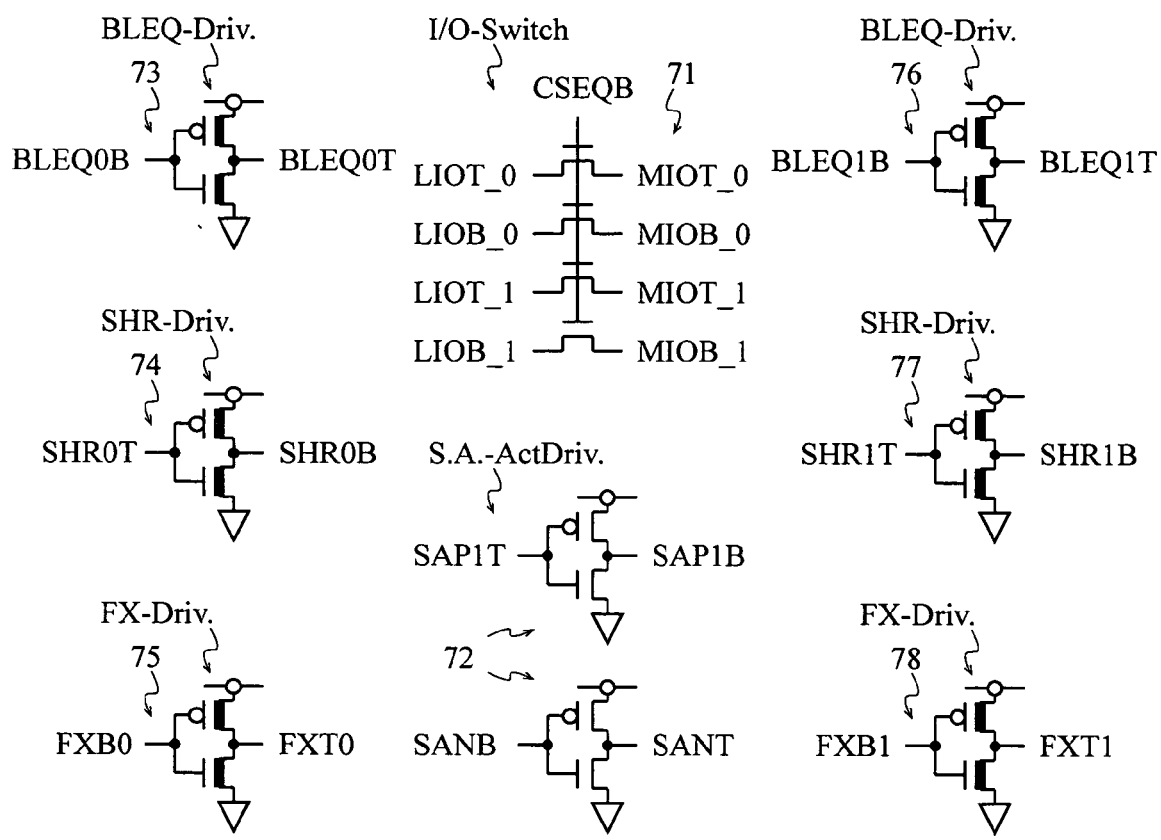
FIG. 9 is a partial circuit diagram of the small-sized intersection region of FIG. 4.

Referring to FIG. 9, the small-sized intersection region 34 shown in FIG. 6 comprises three regions arranged in the BL direction. The center region of the small-sized intersection region 34 shown in FIG. 6 comprises an I/O switch 71 and an S.A.-ActDriv. 72 aligned in the WL direction.

Referring to FIG. 9, the I/O switch 71 connects the LIOT_0 line, the LIOB_0 line, the LIOT_1 line and the LIOB_1 line to an MIOT_0 line, an MIOB_0 line, an MIOT_1 line and an MIOB_1 line, respectively in response to a CSEQB signal. The MIOT_0 line, the MIOB_0 line, the MIOT_1 line and the MIOB_1 line are main data line for transmitting data.

The S.A.-ActDriv. 72 generates the SAP1B signal for activating the CS-Driv. (OD) 61 in response to a SAP1T signal and generates the SANT signal for activating the CS-Driv. (GND) 65 in response to a SANB signal.

Referring to FIG. 9, one of the remaining regions of the small-sized intersection region 34 shown in FIG. 6 comprise a first BLEQ-Driv. 73, a first SHR-Driv. 74 and a first FX-Driv. 75 aligned in the WL direction in that order. The first BLEQ-Driv. 73 generates the BLEQ0T signal for activating the first BLEQ 51 shown in FIG. 7 in response to a BLEQ0B signal. The SHR-Driv. 74 generates the SHR0B signal for activating the first SHR 52 in response to an SHR0T signal. The FX-Driv. 75 generates the first FXT0 signal for activating the SWD-Driv. (0) in response to the FXB0 signal.

The other remaining region of the small-sized intersection region 34 shown in FIG. 6 comprises a second BLEQ-Driv. 76, a second SHR-Driv. 77 and a second FX-Driv. 78 aligned in the WL direction in that order. The BLEQ-Driv. 76 generates the BLEQ1T signal for activating the second BLEQ 57 in response to a BLEQ1B signal. The SHR-Driv. 77 generates the SHR1B signal for activating the second SHR 56 in response to a SHR1T signal. The second FX-Driv. 78 generates the FXT1 signal for activating the SWD-Driv. (1) in response to the FXB1 signal.

Figure 10:
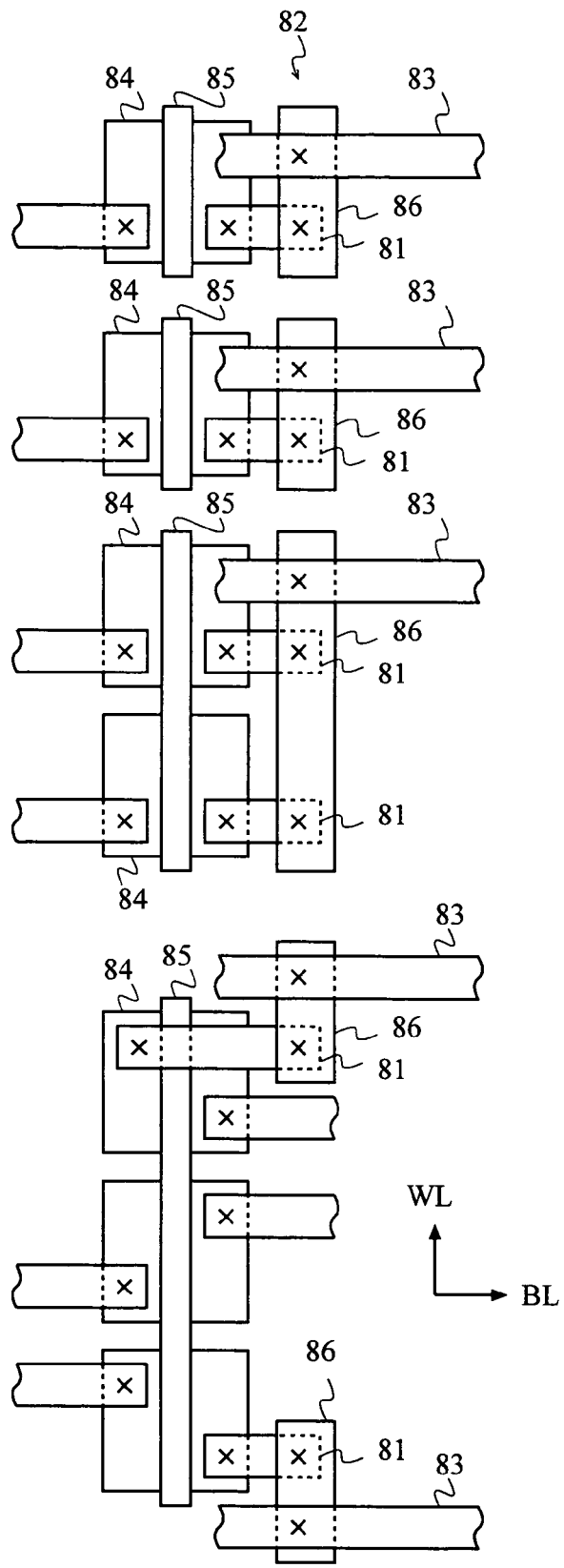
FIG. 10 is a partial plan view of the sense amplifier region of FIG. 4.

Referring to FIG. 10, the first line layer 11 shown in FIG. 2 further comprises a first line group 81. A plurality of lines of the first line group 81 are elongated along the BL direction. Each of the circuit of the eighth region 48 comprises one or more MOS transistors 84 provided with source/drain nodes and a gate electrode 85 arranged between the source/drain nodes. The gate electrode 85 is elongated along the WL direction. In this embodiment, each of the lines of the first line group 81 is in contact with the source/drain node 84. The MOS transistors 84 may be connected with a plurality of lines of the first line group 81.

Referring to FIG. 10, the second line layer 12 shown in FIG. 2 further comprises a second line group 82. The second line group 82 comprises a plurality of lines 86 elongated along the WL direction and aligned in a line. At least one of the lines 86 are provided corresponding to the CS-Driv. (OD) 61, the CS-EQ 62, the CS-Driv. (Restor) 63, the LI/O-EQ 64 and the CS-Driv. (GND) 65. In this embodiment, each line 86 of the second line group 82 is directly connected with one or more lines of the first line group 81. Two or more lines 86 may be provided corresponding to a circuit in the eighth region 48.

Referring to FIG. 10, the third line layer 13 shown in FIG. 2 further comprises a third line group 83. The third line group 83 comprises the VOD line, the VBLP lines, the VARY line and the VSSSA line. In this embodiment, each line of the third line group 83 is in contact with the second line group 82. Two or more lines of the third line group 83 may be provided corresponding to a circuit in the eighth region 48.

Figure 11:
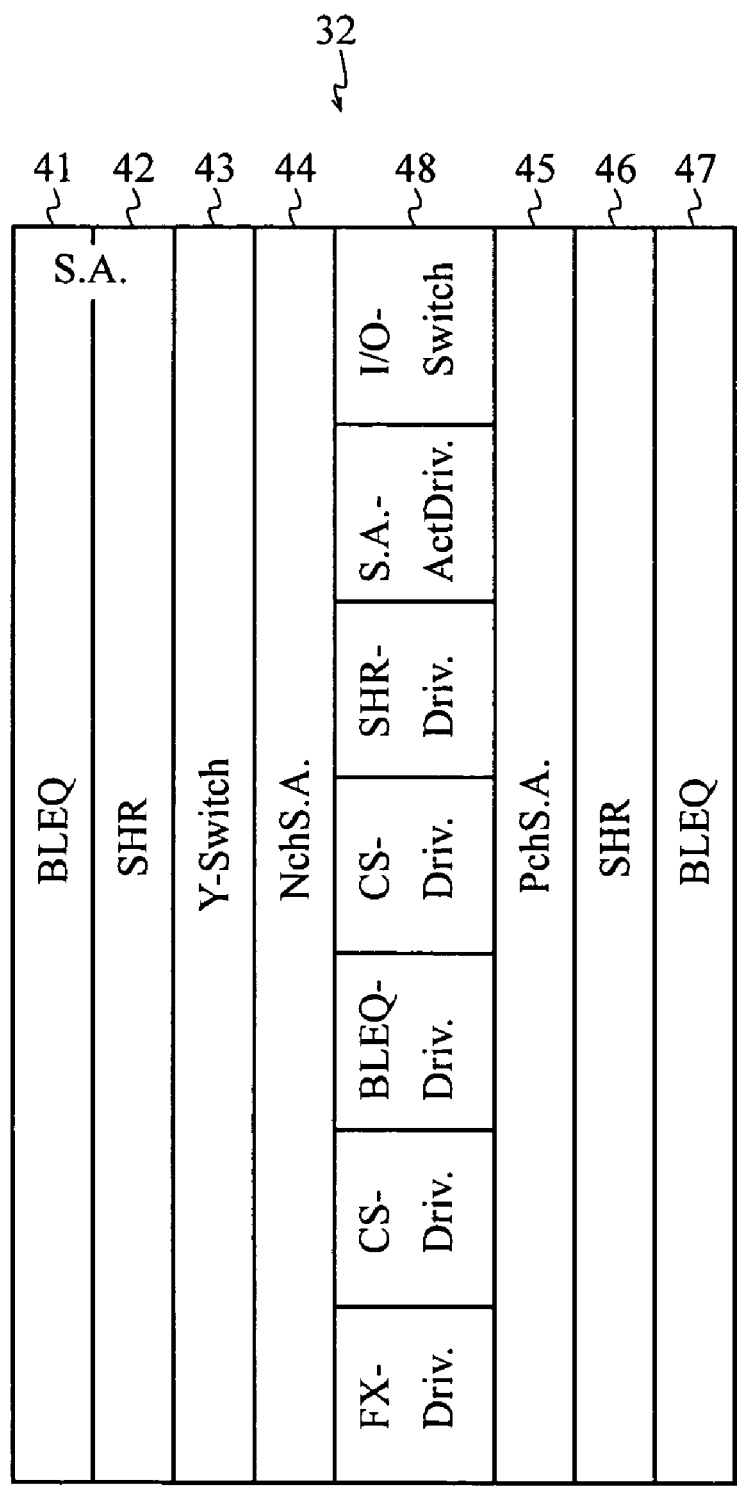
FIG. 11 is a plan view of a sense amplifier region of another embodiment.

As shown in FIG. 11, the eighth region 48 may comprise the circuits of the small-sized intersection region 34, such as the I/O switch 71, the S.A.-ActDriv. 72, the first BLEQ-Driv. 73, the first SHR-Driv. 74, the first FX-Driv. 75, the second BLEQ-Driv. 76, the second SHR-Driv. 77 and the second FX-Driv. 78.

Figure 12:
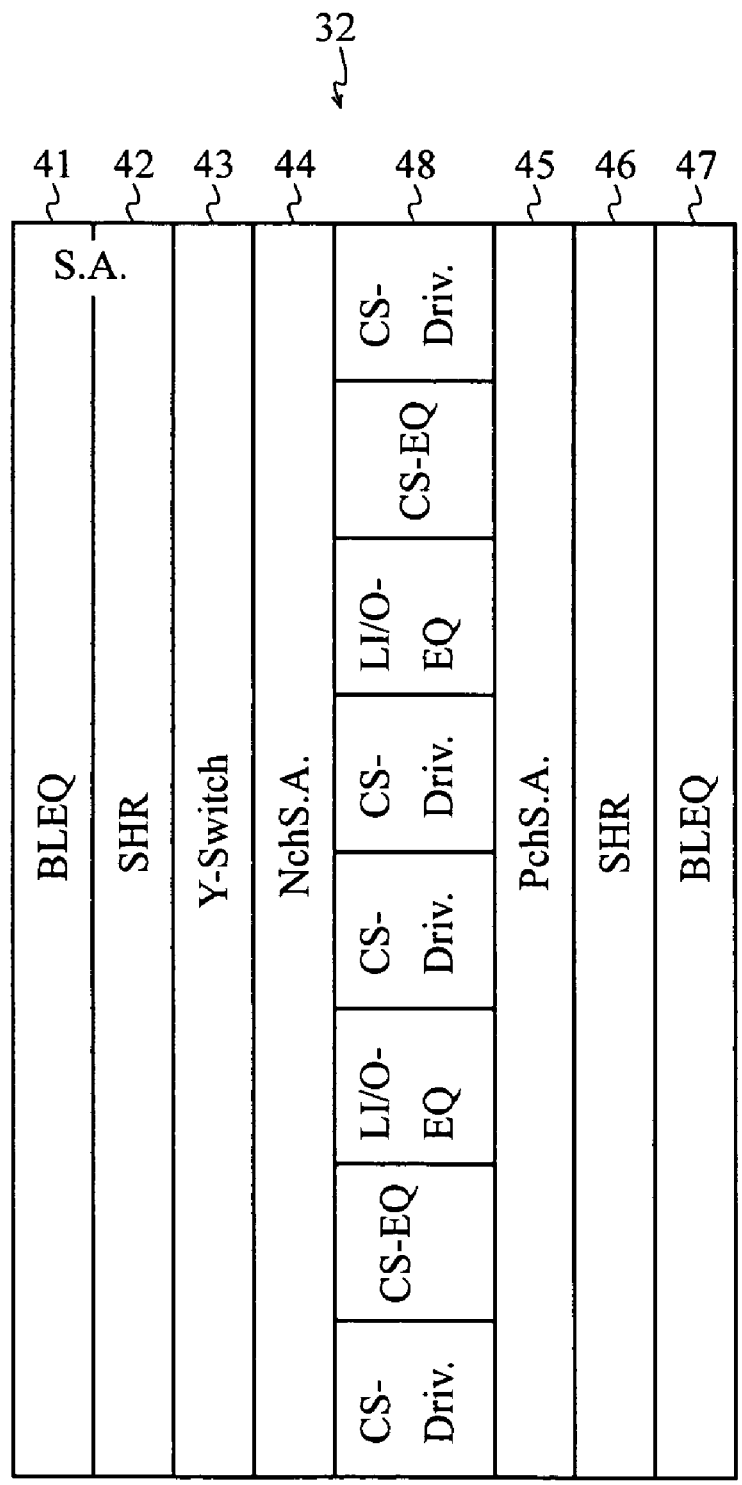
FIG. 12 is a plan view of a sense amplifier region of another embodiment.

As shown in FIG. 12, the eighth region 48 may comprise a plurality of circuits serving a same function, such as a plurality of CS-EQ 62 and a plurality of LI/O-EQ 64.

Figure 13:
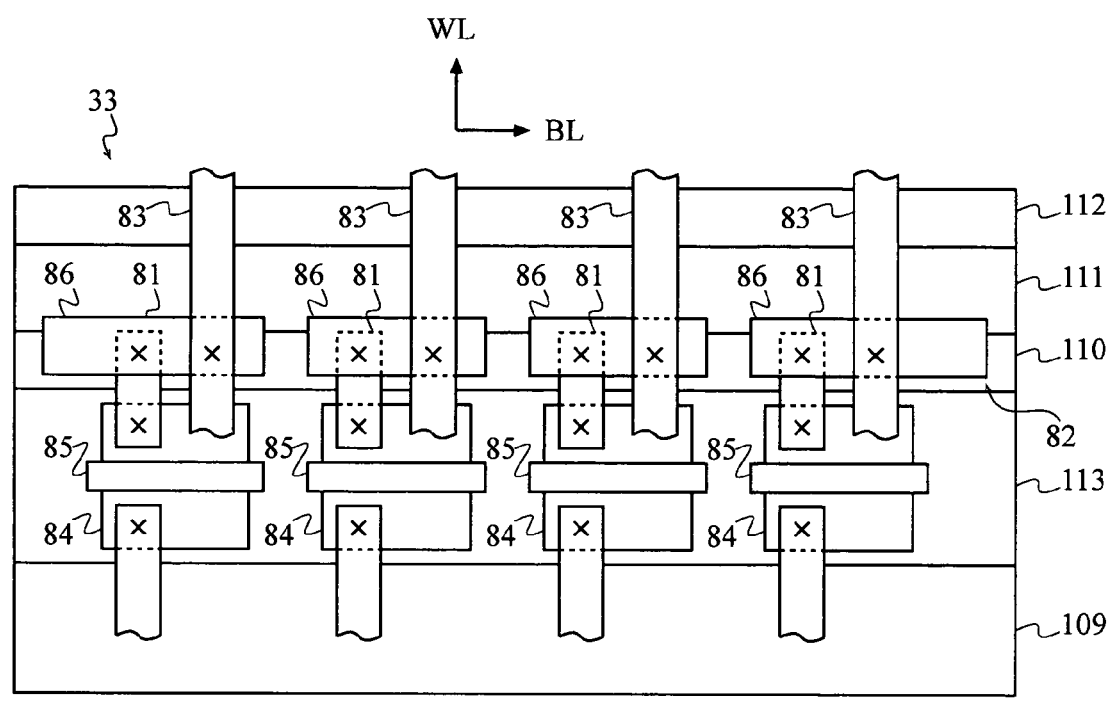
FIG. 13 is a partial plan view of the sub word driver region of FIG. 4.

Referring to FIG. 13, the SWD region 33 of a second embodiment of the present invention comprises ninth to thirteenth region 109 to 113. Each of the ninth to the thirteenth region 109 to 113 is elongated along the BL direction and comprises a plurality of circuit aligned in the BL direction. The ninth to the twelfth region 109 to 112 are arranged in that order along the WL direction. The thirteenth region 113 is arranged between the ninth region 109 and the tenth region 110.

Each of the ninth to the twelfth region 109 to 112 comprises a plurality of MOS transistors 91 to 93 shown in FIG. 8 which constitute the plurality pairs of the SWD-Driv. (0) to (3).

The thirteenth region 113 comprises a plurality of circuits of the eight region 48 of the first embodiment, such as the CS-Driv. (OD) 61, the CS-EQ 62, the CS-Driv. (Restor) 63, the LI/O-EQ 64, the CS-Driv. (GND) 65. The thirteenth region 113 may comprise a plurality of circuits of the small-sized intersection region 34 of the first embodiment, such as the I/O Switch 71, the S.A.-ActDriv. 72, the first BLEQ-Driv. 73, the first SHR-Driv. 74, the first FX-Driv. 75, the second BLEQ-Driv. 76, the second SHR-Driv. 77 and the second FX-Driv. 78.

In this embodiment, the plurality of lines of the first line group 81 are elongated along the WL direction. The plurality of lines 86 of the second line group 82 are elongated along the BL direction and are aligned in a line. The plurality of lines of the third line group 83 are elongated along the WL direction.

Figure 14:
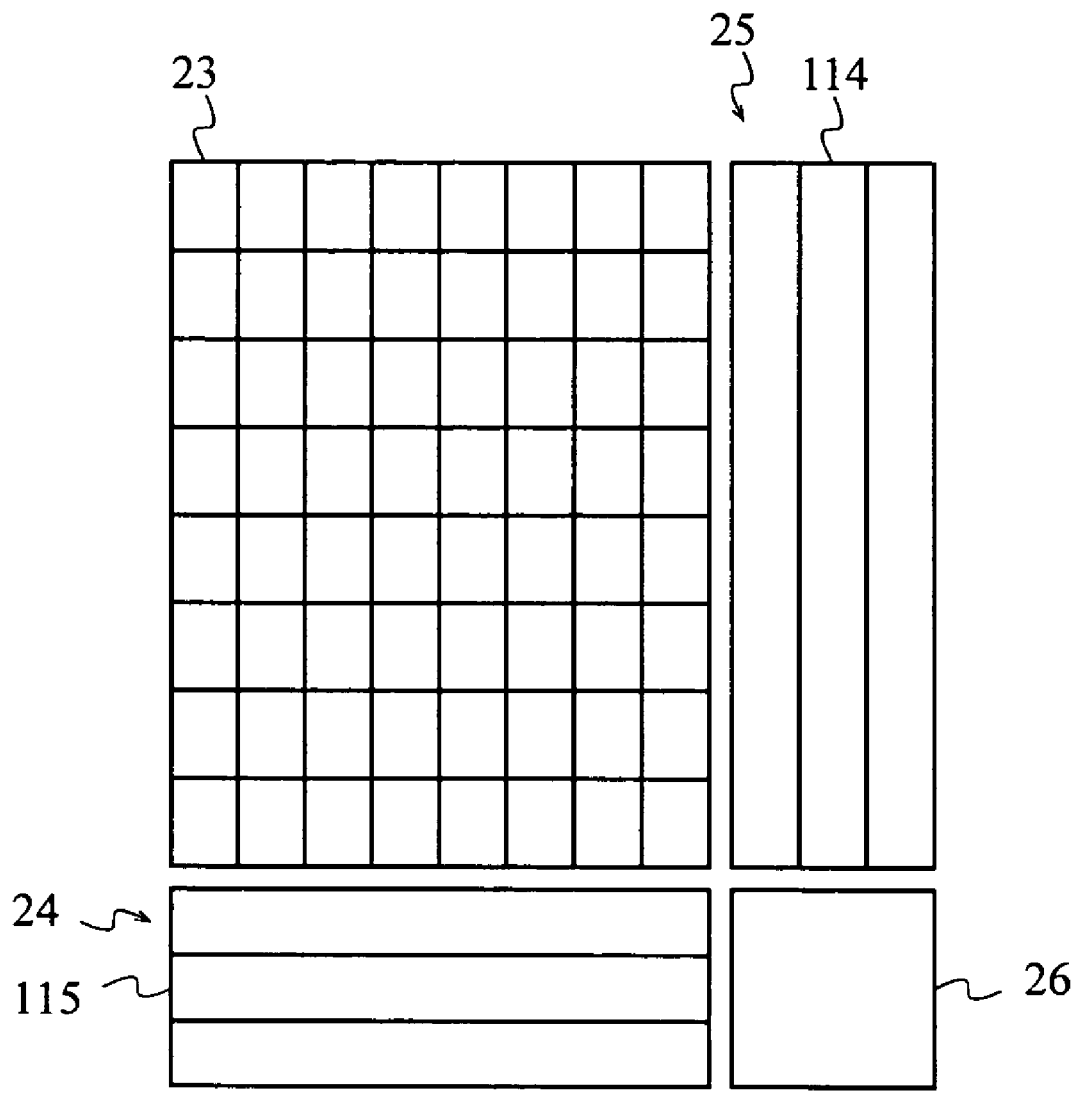
FIG. 14 is a plan view of a middle-sized block of another embodiment.

Referring to FIG. 14, the Y-DEC region 25 of a third embodiment of the present invention may comprise a fourteenth region 114. The fourteenth region 114 comprises a plurality of circuits aligned in the WL direction. Preferably, the circuits of the fourteenth region 114 of this embodiment may be circuits which are arranged in the middle-sized intersection region 26 in a conventional semiconductor memory device.

The first line layer 11 of this embodiment comprises fourth line group which includes a plurality of lines elongated along the BL direction. The lines of the fourth line group are in contact with MOS transistors of the circuits of the fourteenth region 114. The second line layer 12 comprises a fifth line group which includes a plurality of lines elongated along the WL direction and aligned in a line. The lines of the fifth line group are in contact with the lines of the fourth line group. The third line layer 13 comprises a sixth line group which includes a plurality of lines. The lines of the sixth line group are in contact with the lines of the fifth line group.

The X-DEC region 24, as shown in FIG. 14, may comprise a fifteenth region 115. The fifteenth region 115 comprises a plurality of circuits aligned in the BL direction. Preferably, the circuits of the fifteenth region 115 of this embodiment may be circuits which are arranged in the middle-sized intersection region 26 in a conventional semiconductor memory device.

The first line layer 11 of this embodiment comprises seventh line group which includes a plurality of lines elongated along the WL direction. The lines of the seventh line group are in contact with MOS transistors of the circuits of the fifteenth region 115. The second line layer 12 comprises an eighth line group which includes a plurality of lines elongated along the BL direction and aligned in a line. The lines of the eighth line group are in contact with the lines of the seventh line group. The third line layer 13 comprises a ninth line group which includes a plurality of lines. The lines of the ninth line group are in contact with the lines of the eighth line group.

This application is based on Japanese Patent Application Serial no. 2005-318143 filed in Japan Patent Office on Nov. 1, 2005, the contents of which are herein incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor memory device comprising:
   a memory cell array block; and
   a circuit region arranged with the memory cell array block along a first direction, wherein the circuit region comprises a first region and a second region arranged with the first region along the first direction, the first region comprises a first circuit and a second circuit which are aligned in a second direction perpendicular to the first direction and which have functions different from each other, the second region comprises a plurality of third circuits which are aligned in the second direction and which have functions same as each other.

2. The semiconductor memory device according to claim 1, further comprising:
   a first line elongated along the second direction and electrically coupled to the first circuit; and
   a second line elongated along the second direction and electrically coupled to the second circuit, the second line being separated from the first line.

3. The semiconductor memory device according to claim 2, wherein the first line and the second line are aligned with each other in the second direction.

4. The semiconductor memory device according to claim 2, further comprising:
   a third line which is electrically coupled to the first line to supply a first voltage for the first circuit; and
   a fourth line which is different from the third line and is electrically coupled to the second line to supply a second voltage for the second circuit.

5. The semiconductor memory device according to claim 1, wherein the circuit region is a sense amplifier region where a plurality of sense amplifiers are disposed.

6. The semiconductor memory device according to claim 1, wherein the circuit region is a sub word region where a plurality of sub word drivers are disposed.

7. The semiconductor memory device according to claim 1, wherein the circuit region is an x decoder region where a plurality of X decoders are disposed.

8. The semiconductor memory device according to claim 1, wherein the circuit region is a y decoder region where a plurality of Y decoders are disposed.

* * * * *